United States Patent
Coyner et al.

(10) Patent No.: US 9,129,964 B2
(45) Date of Patent: Sep. 8, 2015

(54) PROGRAMMABLE ELECTRICAL FUSE

(71) Applicant: International Business Machines Corporation, Armonk, NY (US)

(72) Inventors: Jason Coyner, Milton, VT (US); Baozhen Li, South Burlington, VT (US); Keith Kwong Hon Wong, Wappingers Falls, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/871,042

(22) Filed: Apr. 26, 2013

(65) Prior Publication Data
US 2014/0319650 A1    Oct. 30, 2014

(51) Int. Cl.
H01L 23/525   (2006.01)
H01L 21/768   (2006.01)
H01L 23/532   (2006.01)

(52) U.S. Cl.
CPC ...... *H01L 23/5256* (2013.01); *H01L 21/76888* (2013.01); *H01L 23/5329* (2013.01); *H01L 23/53295* (2013.01); H01L 23/53223 (2013.01); H01L 23/53238 (2013.01); H01L 23/53266 (2013.01)

(58) Field of Classification Search
CPC ............ H01L 23/5256; H01L 21/76888
USPC ......... 257/529, E21; 438/624, 138, 130, 132, 438/215, 281
See application file for complete search history.

(56) References Cited

U.S. PATENT DOCUMENTS

| | | | |
|---|---|---|---|
| 6,033,939 A * | 3/2000 | Agarwala et al. | 438/132 |
| 6,249,038 B1 * | 6/2001 | Daubenspeck et al. | 257/529 |
| 7,382,036 B2 | 6/2008 | Nowak et al. | |
| 7,436,044 B2 | 10/2008 | Khan et al. | |
| 7,572,724 B2 | 8/2009 | Nowak et al. | |
| 8,232,190 B2 | 7/2012 | Bernstein et al. | |
| 2007/0189053 A1 | 8/2007 | Pellizzer et al. | |
| 2009/0021338 A1 | 1/2009 | Kim et al. | |

(Continued)

OTHER PUBLICATIONS

R. F. Rizzolo, "IBM System z9 eFUSE applications and methodology", IBM J. Res. & Dev., vol. 51, No. 1/2, Jan./Mar. 2007, pp. 65-75.

(Continued)

*Primary Examiner* — Sheng Zhu
(74) *Attorney, Agent, or Firm* — L. Jeffrey Kelly; Catherine Ivers

(57) ABSTRACT

A method of forming an electronic fuse including forming a first metal line and a second metal line in a first interconnect level, the first metal line is electrically insulated from the second metal line, forming a single via in a second interconnect level above the first interconnect level, the via is made from the same material as either the first metal line or the second metal line, and the via is in direct contact with both the first metal line and the second metal line, a contact area between the via and the first metal line or the second metal line ranges from about 5% to about 25% of a total cross-sectional area of the via, the via has a height to width ratio greater than 1, and forming a third metal line in the second interconnect level in direct contact with the via.

20 Claims, 4 Drawing Sheets

(56) References Cited

U.S. PATENT DOCUMENTS

| | | |
|---|---|---|
| 2009/0085152 A1 | 4/2009 | Bernstein et al. |
| 2009/0251275 A1* | 10/2009 | Tsuda ............................ 337/290 |
| 2010/0096724 A1* | 4/2010 | Kubota et al. ................. 257/529 |
| 2011/0241162 A1* | 10/2011 | Kurz et al. ..................... 257/529 |
| 2012/0049321 A1 | 3/2012 | Abou-Khalil et al. |
| 2012/0091556 A1 | 4/2012 | Gebreselasie et al. |
| 2012/0196434 A1 | 8/2012 | Thei et al. |

OTHER PUBLICATIONS

William R. Tonti, "eFuse Design and Reliability", IBM Microelectronics, Division Semiconductor Research & Development.

Toshiba, ASIC & Foundry, "eFUSE—Electrical Programmable Fuse One-Time-Programmable (OTP) Memory Macro", http://www.toshiba-components.com/ASIC/eFUSE.html.

* cited by examiner

PROGRAMMABLE ELECTRICAL FUSE

BACKGROUND

The present invention relates generally to semiconductors, and, more particularly, to a programmable electrical fuse.

A fuse is an electrical structure that is normally conducting that with the application of a suitable electrical current is "blown" to form an open in the circuit. Programming refers to applying a current to intentionally blow a fuse and create an open circuit. In integrated circuitry memory devices, fuses can be used for activating redundancy in memory chips and for programming functions and codes in logic chips. Specifically, dynamic random access memory (DRAM) and static random access memory (SRAM) may employ fuses for such purposes.

Electrical fuses (e-fuses) can also be used to prevent decreased chip yield caused by random defects generated in the manufacturing process. Moreover, e-fuses provide for future customization of a standardized chip design. For example, e-fuses may provide for a variety of voltage options, packaging pin out options, or any other options desired by the manufacturer to be employed prior to the final processing. These customization possibilities make it easier to use one basic design for several different end products and help increase chip yield.

Some e-fuses take advantage of electromigration effects to blow and create the open circuit. For example, electromigration can be defined as the transport of material caused by the gradual movement of ions in a conductor due to the momentum transfer between conducting electrons and diffusing metal atoms. In e-fuses that take advantage of electromigration effect, such transport of material caused by the gradual movement of ions can produce voids which cause the e-fuse to blow and create the open circuit or an increase in resistance above a pre-set target.

However, in a typical e-fuse, electromigration may cause unpredictable voids; thus, potentially creating the open circuit in undesirable locations. Furthermore, typical e-fuse programming may require high programming currents and long programming times. Such programming currents and times may result in unpredictable void formation which may negatively affect other circuits adjacent to the e-fuse. Therefore, it may be desirable to program an e-fuse with lower programming currents and shorter programming times. In addition, predictable and repeatable void formation may also be preferred.

Accordingly, there exists a need in the art to overcome the deficiencies and limitations described above.

SUMMARY

According to one exemplary embodiment of the present invention, a method of forming an electronic fuse in a semiconductor is provided. The method may include forming a first metal line and a second metal line in a first interconnect level, wherein the first metal line is electrically insulated form the second metal line, and forming a via in a second interconnect level above the first interconnect level, the via electrically connecting the first metal line with the second metal line.

According to another exemplary embodiment of the present invention, a structure of an electronic fuse in a semiconductor is provided. The structure may include a first metal line and a second metal line in a first interconnect level, wherein the first metal line is electrically insulated form the second metal line, and a via in a second interconnect level above the first interconnect level, the via electrically connecting the first metal line with the second metal line.

According to another exemplary embodiment of the present invention, a structure is provided. The structure may include a first metal line in a first interconnect level, a second metal line in the first interconnect level, wherein the first metal line is electrically insulated form the second metal line, a via in a second interconnect level above the first interconnect level, the via electrically connecting the first metal line with the second metal line, wherein the contact area between the via and the first metal line or the contact area between the via and the second metal line is less than 50% of a total cross-sectional area of the via, the contact area and the cross-sectional area of the via being measured at a top surface of the first and second metal lines, and a third metal line above and in electrical contact with the via.

BRIEF DESCRIPTION OF THE SEVERAL VIEWS OF THE DRAWINGS

The following detailed description, given by way of example and not intend to limit the invention solely thereto, will best be appreciated in conjunction with the accompanying drawings, in which:

FIG. 2 depicts an $M_{x+1}$ dielectric layer on top of an $M_x$ level according to an exemplary embodiment.

FIG. 3 depicts the formation of a dual damascene feature according to an exemplary embodiment.

FIG. 4 depicts a final e-fuse structure according to an exemplary embodiment.

FIG. 5 depicts a final e-fuse structure after programming according to an exemplary embodiment.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
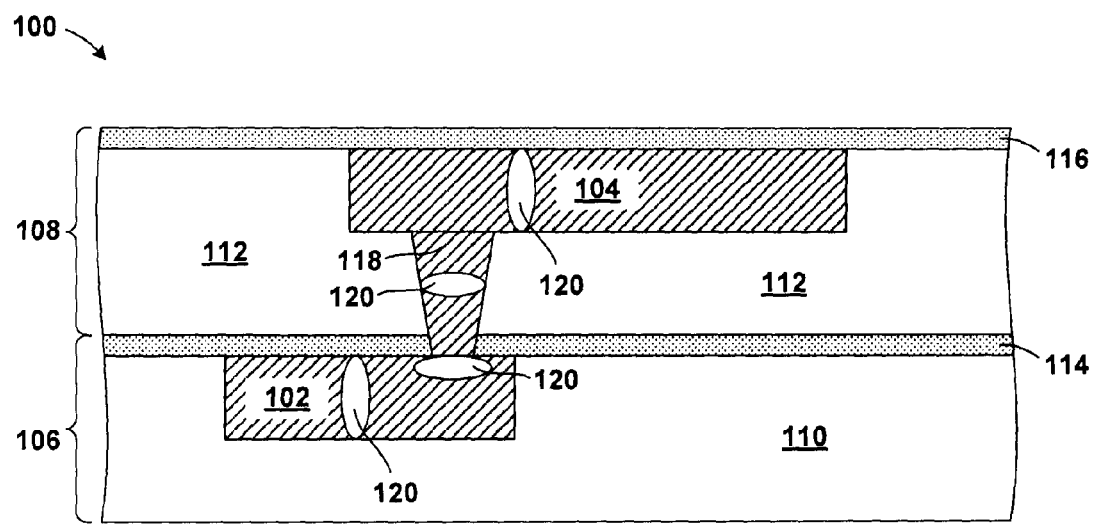
FIG. 1 depicts a cross-sectional view of a typical e-fuse structure after programming according to the prior art.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiment set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Also the term "sub-lithographic" may refer to a dimension or size less than current dimensions achievable by photolithographic processes, and the term "lithographic" may refer to a dimension or size equal to or greater than current dimensions achievable by photolithographic processes. The sub-lithographic and lithographic dimensions may be determined by a person of ordinary skill in the art at the time the application is filed.

The present invention relates generally to semiconductors, and, more particularly, to a programmable electrical fuse. The e-fuse structure may include a first metal line and a second metal line in the same level, and a via in another level electrically connecting the first metal line to the second metal line. The contact between the via and the first and second metal lines is unique to this e-fuse structure, and may locally increase the current density and resistance thereby decreasing applicable programming currents and reducing programming times.

Advantageously, the formation of the e-fuse structure of the present invention can be implemented in the back-end-of-line (BEOL), and is compatible with current process flows. The BEOL may be distinguished from FEOL in that semiconductor devices, for example transistors, may be fabricated in the FEOL while the connections to and between those semiconductor devices may be formed in the BEOL. The present invention thus allows the e-fuse to be fabricated during normal interconnect process flows, thus advantageously reducing processing costs for manufacturing e-fuses which are normally fabricated in different process flows.

More specifically, multilayer electronic components include multiple layers of a dielectric material having metallization in each layer. The metallization typically comprise a metal line and a via. The metallization of each dielectric layer may be formed using a filling technique such as electroplating, electroless plating, chemical vapor deposition, physical vapor deposition or a combination of methods. The metallization and dielectric layer may be capped with a cap dielectric, which may be, for example, a silicon nitride, silicon carbide, or a silicon carbon nitride ($SiC_xN_yH_z$) such as N-Blok. In the present case, the metallization of a particular dielectric layer, in a particular region, may be referred to as a fuse line as will be described in detail below.

By way of example FIG. 1 illustrates a structure 100 having a typical BEOL vertical e-fuse structure in which the electromigration failure mode of the e-fuse structure after programming is depicted. The e-fuse may include an $M_x$ level 106, an $M_{x+1}$ level 108, and a via 118. The $M_x$ level 106 may include an $M_x$ dielectric 110 and an $M_x$ metal 102. The $M_{x+1}$ level 108 may include an $M_{x+1}$ dielectric 112 and an $M_{x+1}$ metal 104. An $M_x$ cap dielectric 114 may be located between the $M_x$ dielectric 110 and the $M_{x+1}$ dielectric 112 and electrically insulate the $M_x$ metal 102 from the $M_{x+1}$ metal 104. An $M_{x+1}$ cap dielectric 116 may be located above the $M_{x+1}$ dielectric 112 and electrically insulate the $M_{x+1}$ metal 104 layer from additional interconnect levels (not shown) that may be subsequently formed above.

The via 118 electrically connects the $M_x$ metal 102 to the $M_{x+1}$ metal 104. The $M_x$ metal 102, the $M_{x+1}$ metal 104, and the via 118 make up the typical e-fuse. A suitable programming current for the structure 100 in FIG. 1 may range from about 5 mA to about 30 mA, and ranges there between. Alternatively, programming may be expressed as a threshold current density. For example, a typical current density of 100 $mA/cm^2$ may be required to program the e-fuse. Additionally, a circuit is considered to be programmed, and open, when the e-fuse resistance increases more than an order of magnitude over the initial pre-programmed resistance of the e-fuse. During programming of the e-fuse, one or more voids 120 may form in unexpected locations due to non-optimized processing. Location of the voids 120 may be uncontrollable and may affect the yield and reliability of the e-fuse. The voids 120 are due in part to the electromigration of conductive interconnect material within the e-fuse. For example, one void 120 may be located in the $M_x$ metal 102 and cause the e-fuse to blow at the $M_x$ metal 102. Therefore, an open circuit is formed at the $M_x$ metal 102 during programming. An open circuit may be the desired result of programming the e-fuse, however, an open circuit in the $M_x$ metal 102 may affect other circuits (not shown) that may be connected to the a $M_x$ metal 102. It should be noted that multiple voids are depicted as illustrative examples, and depending on the direction of the current, the voids 120 may form in the $M_x$ metal 102, the via 118, or the $M_{x+1}$ metal 104.

Ideally, low programming currents and short programming times are preferable when programming an e-fuse. One way to achieve lower programming currents and shorter programming times may include increasing the current density and resistance thereby encouraging electromigration and the formation of a void. One embodiment by which to achieve lower programming currents and shorter programming times by increasing the current density and resistance is described in detail below by referring to the accompanying drawings FIGS. 2-4. In the present embodiment, a via may be used electrically connect two adjacent metal lines of the same interconnect level.

Figure 2:
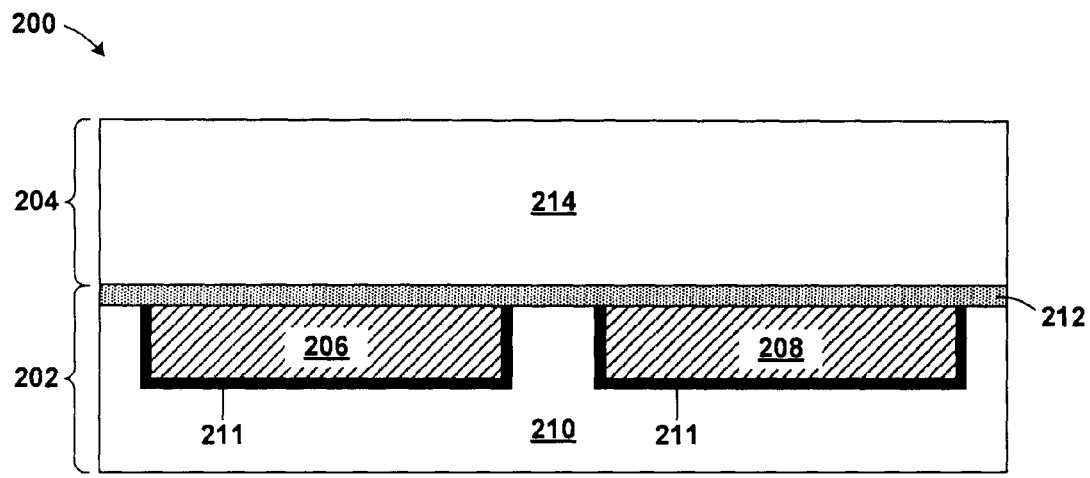
FIGS. 2-5 illustrate the steps of a method of forming an e-fuse according to an exemplary embodiment.

Referring now to FIG. 2, a structure 200 is shown. The structure 200 may include an $M_x$ level 202 and an $M_{x+1}$ level 204. The $M_x$ level 202 may include a first metal line 206 and a second metal line 208 formed in an $M_x$ dielectric 210. The $M_x$ level 202 may further include an $M_x$ cap dielectric 212 above the first and second metal lines 206, 208 and above the $M_x$ dielectric 210. The $M_x$ level 202 may be any interconnect level in the structure 200. The $M_x$ dielectric 210 may include any suitable dielectric material, for example, silicon oxide ($SiO_2$), silicon nitride ($Si_3N_4$), hydrogenated silicon carbon oxide (SiCOH), silicon based low k dielectrics, or porous dielectrics. Known suitable deposition techniques, such as, for example, chemical vapor deposition, plasma enhanced chemical vapor deposition, atomic layer deposition, or physical vapor deposition may be used to form the $M_x$ dielectric 210. The $M_x$ dielectric 210 may have a typical thickness ranging from about 100 nm to about 450 nm and ranges there between, although a thickness less than 100 nm and greater than 450 nm may be acceptable. It should be noted that while only a single interconnect level is shown, the structure 200 may have multiple interconnect levels above and below the $M_x$ level 202.

The first and second metal lines 206, 208 may be formed in the $M_x$ dielectric 210 in accordance with typical lithography techniques. Both the first and second metal lines 206, 208 may consist of a typical line or wire found in a typical semiconductor circuit. The first and second metal lines 206, 208 may be substantially similar structures and may be fabricated using, for example, a typical single or dual damascene technique in which a conductive interconnect material may be deposited in a trench formed in the $M_x$ dielectric 210.

In one embodiment, the first and second metal lines 206, 208 may include various barrier liners, for example the barrier liners 211. One barrier liner may include, for example, tantalum nitride (TaN), followed by an additional layer including tantalum (Ta). Other barrier liners may include cobalt (Co), or ruthenium (Ru) either alone or in combination with any other suitable liner. The conductive interconnect material may include, for example, copper (Cu), aluminum (Al), or tungsten (W). The conductive interconnect material may be formed using a filling technique such as electroplating, electroless plating, chemical vapor deposition, physical vapor deposition or a combination of methods. The conductive interconnect material may alternatively include a dopant, such as, for example, manganese (Mn), magnesium (Mg), copper (Cu), aluminum (Al) or other known dopants. A seed layer (not shown) may optionally be deposited using any suitable deposition technique, for example chemical vapor deposition or physical vapor deposition, prior to filling the trench. The seed layer may also include similar dopants as the conductive interconnect material.

With continued reference to FIG. 2, the $M_x$ cap dielectric 212 may be deposited over the structure 200. The $M_x$ cap dielectric 212 may electrically insulate the $M_x$ level 202 from additional interconnect levels (not shown) that may be subsequently formed above the $M_x$ level 202, for example the $M_{x+1}$ level 204. The $M_x$ cap dielectric 212 may be used to improve interconnect reliability and prevent copper from diffusing into an $M_{x+1}$ dielectric that may be subsequently formed above. The $M_x$ cap dielectric 212 may be deposited using typical deposition techniques, for example, chemical vapor deposition. The $M_x$ cap dielectric 212 may include any suitable dielectric material, for example, silicon nitride ($Si_3N_4$), silicon carbide (SiC), silicon carbon nitride (SiCN), hydrogenated silicon carbide (SiCH), or other known capping materials. The $M_x$ cap dielectric 212 may have a thickness ranging from about 15 nm to about 55 nm and ranges there between, although a thickness less than 15 nm and greater than 55 nm may be acceptable. Next, the $M_{x+1}$ level 204 may be formed above the $M_x$ level 202. The $M_{x+1}$ level 204 may include an $M_{x+1}$ dielectric 214. The $M_{x+1}$ dielectric 214 may be substantially similar in all respects to the $M_x$ dielectric 210 described above.

Figure 3:
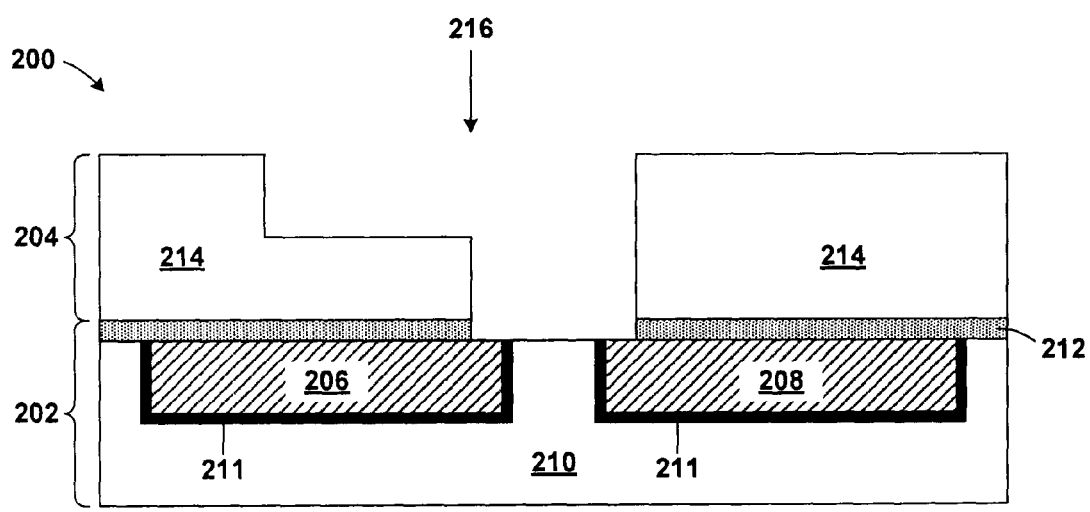

Referring now to FIG. 3, a dual damascene opening 216 may be formed in the $M_{x+1}$ dielectric 214, of the $M_{x+1}$ level 204 using. The dual damascene opening 216 may include a trench opening and a via opening. The dual damascene opening 216 may be formed using any suitable masking and etching technique known in the art. In one embodiment, a dry etching technique using a fluorine based etchant, such as, for example $C_xF_y$, may be used. The trench opening may be any size and shape suitable for the formation of any BEOL interconnect structure so desired.

The via opening may extend vertically from a bottom of the trench opening to a top of the first and second metal lines 206, 208. The first and second metal lines 206, 208 may preferably be exposed by the formation of the dual damascene opening 216, more specifically, by the formation of the via opening. As illustrated, the formation of the via opening may expose only a small portion of each of the first and second metal lines 206, 208, as well as a portion of the $M_x$ dielectric 210 located between the first and second metal lines 206, 208. In one embodiment, only the via opening, using a single damascene technique, may be formed in the $M_{x+1}$ dielectric 214 as opposed to the dual damascene opening 216 illustrated in the figure.

Figure 4:
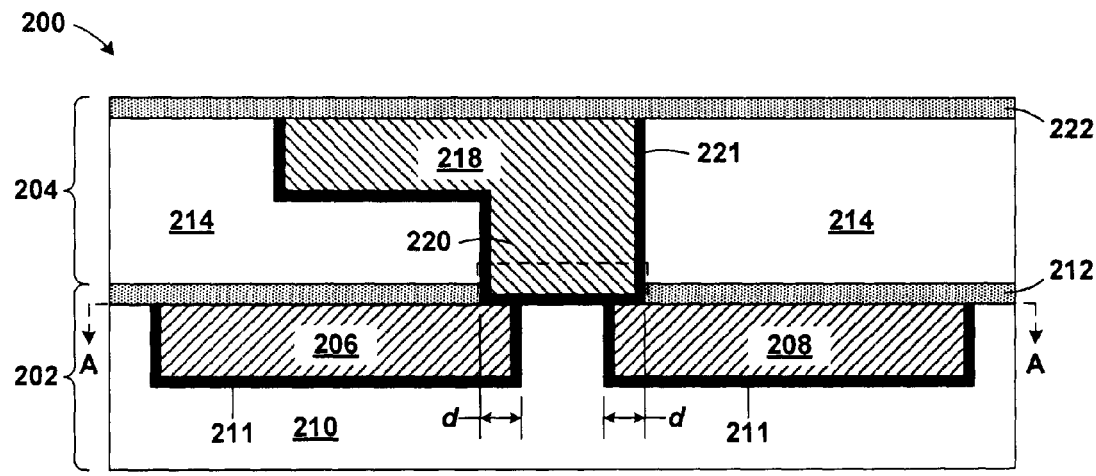

Referring now to FIG. 4, the dual damascene opening 216 may be filled with a conductive interconnect material to form a third metal line 218 and a via 220. The conductive interconnect material used to form the third metal line 218 and the via 220 may be substantially similar to that described above with reference to FIG. 2. In one embodiment, the third metal line 218 and the via 220 may include various barrier liners, for example the barrier liner 221, similar to the barrier liners described above with reference to FIG. 2. Furthermore, a seed layer (not shown) may optionally be deposited, as described above, prior to filling the trenches and vias with the conductive interconnect material. After filling the third metal line 218 and the via 220 with the conductive interconnect material an $M_{x+1}$ cap dielectric 222 may be deposited on top of the structure 200. A chemical mechanical polishing technique may be applied to ensure complete removal of excess conductive interconnect material prior to depositing the $M_{x+1}$ cap dielectric 222. The $M_{x+1}$ cap dielectric 222 may be substantially similar to the $M_x$ cap dielectric 210 described above with reference to FIG. 2.

Vias, generally, may be used to form electrical connections between the metallization of two interconnect levels. The via 220 may extend vertically from the third metal line 218 to the first and second metal lines 206, 208, and form a conductive link between the first metal line 206 and the second metal line 208. Generally, the via 220 may have a width or diameter larger than a typical via opening formed in the BEOL. In one embodiment, the via 220 may have an aspect ratio of about 4:1 or more, and a diameter or width ranging from about 10 nm to about 100 nm and ranges there between, although a via diameter less than 10 nm and greater than 100 nm may be acceptable.

Figure 4A:
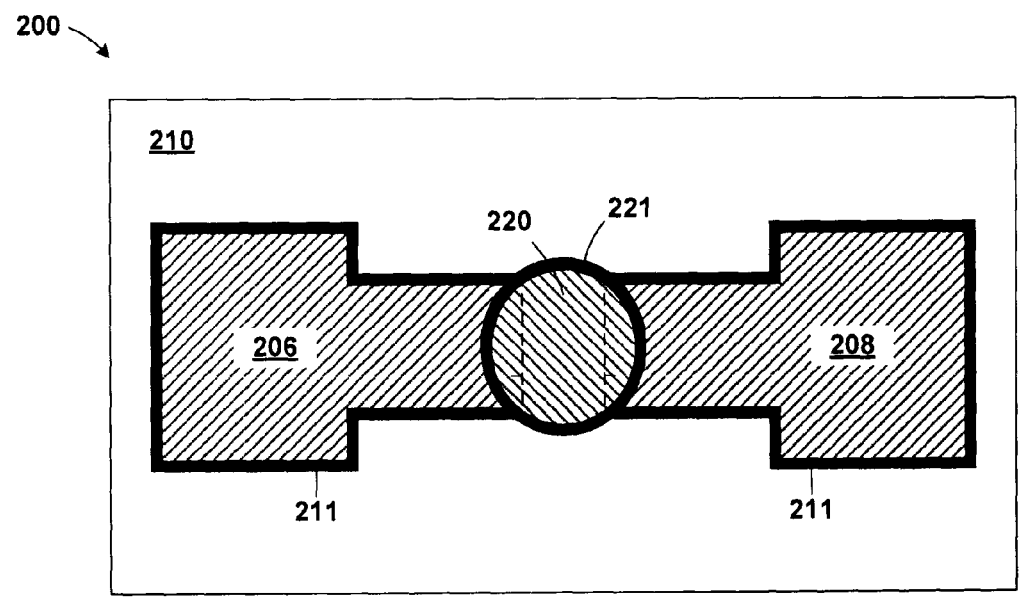
FIG. 4A depicts a cross-section view of FIG. 4, along section line A-A, according to an exemplary embodiment.

The contact area between the first metal line 206 and the via 220, as illustrated in FIG. 4A, may be less than about 50%, and more preferably about 5% to about 25%, of the total cross sectional area of the via 220 as measured at a top surface of the first metal line 206. In one embodiment, the contact area between the second metal line 208 may generally be substantially similar to the contact area between the first metal line 206 and the via 220. In another embodiment, the contact area between the second metal line 208 and the via 220 may be smaller or larger than the contact area between the first metal line 206 and the via 220, and vice versa. It should be noted that the contact area between the first metal line 206 and the via 220 or between the second metal line 208 and the via 220 may be sub-lithographic, as compared to the cross sectional area of the via 220 which may be lithographic.

Alternatively, the overlap distance (d) between either the first metal line 206 and the via 220 or the second metal line 208 and the via 220 may be less than 50% of the diameter of the via 220, and more specifically between about 5% and 25%. In one embodiment, for example, if the via 220 has a diameter of about 80 nm, then the overlap distance (d) may range from about 4 nm to about 20 nm. Because the shape of the via 220 may typically be round, it should be noted that the overlap distance (d) is dependant on the position of the cross section relative to the structure. The present embodiment illustrated in the figures is intended to represent a cross section view taken along a plane which passes through the center of the diameter of the via 220. Thus, the overlap distance (d) may generally decrease as the cross section moves away from the center of the via. It should also be noted that the overlap distance (d) between either the first metal line 206 and the via 220 or the second metal line 208 and the via 220 may be sub-lithographic, as compared to the diameter of the via 220 which may be lithographic.

In one embodiment, with continued reference to FIG. 4A, a portion of the first metal line 206 in contact with the via 220 may have a reduced width, relative to a nominal width of the first metal line 206. Similarly, in one embodiment, a portion of the second metal line 208 in contact with the via 220 may also have a reduced width, relative to a nominal width of the second metal line 208. In another embodiment, both the first and second metal lines 206, 208 may have a reduced width in a portion where they contact the via 220.

The spacing between the first metal line 206 and the second metal line 208 may generally be dictated by the ground rules of the corresponding technology node. In one embodiment, for example, according to 40 nm technology ground rules, the space between the first and second metal lines 206, 208 may generally be equal to or greater than 40 nm. It should be noted however that the spacing between the first and second metal lines 206, 208 is not critical so long as one is electrically insulated from the other. Therefore, the via 220 may preferably have a width or diameter larger than the spacing between the first and second metal lines 206, 208.

With continued reference to FIG. 4, an embodiment of a final e-fuse structure is shown. Therefore, the first metal line 206, the second metal line 208, and the via 220 may together form the final e-fuse structure. The first and second metal lines 206, 208 may include any active interconnect structure in the BEOL. The third metal line 218 may be included for purposes of applying an applicable current and programming the e-fuse. In such cases, the third metal line 218 may be included only to facilitate programming of the e-fuse structure. The e-fuse structure as depicted in the figures may effectively lower the require programming current and shorten the programming time, thereby increasing programming reliability and efficiency.

Figure 5:
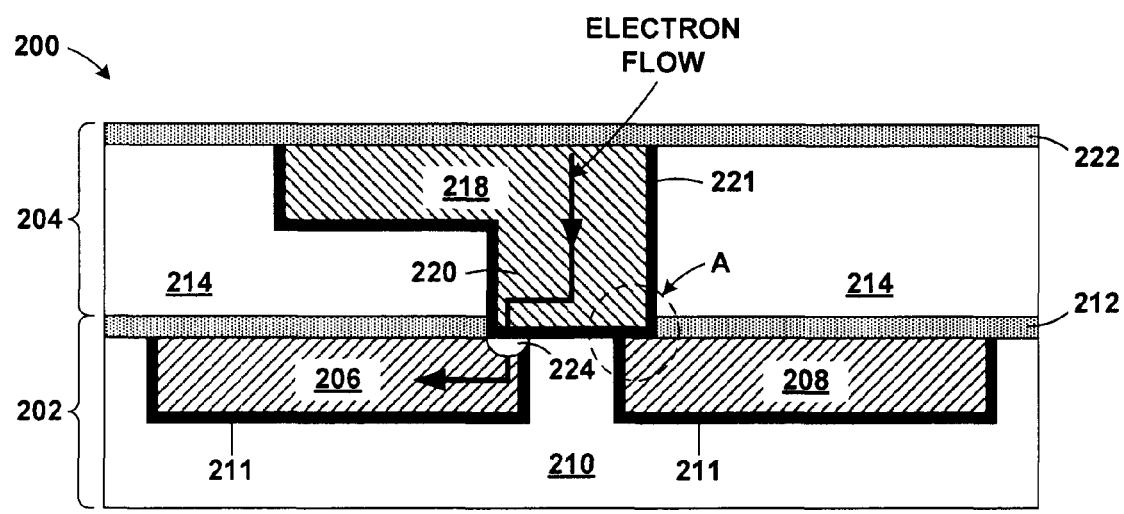

Now referring to FIG. 5, the final e-fuse embodiment is shown after programming. The goal or intention of programming may be to create a disconnection between the first and second metal lines 206, 208. Lower programming currents may be used to program the e-fuse of the structure 200 because of the reduced contact area between the first and second metal lines 206, 208 and the via 220. A programming current ranging from about from about 2 mA to about 15 mA may be used to program the structure 200 of the present embodiment. The reduced contact area may locally increase current density and resistance. As a result of the increased current density and resistance, the intersection between the first and second metal lines 206, 208 and the via 222 may be susceptible to electromigration and subsequent void formation under an applicable flow of current. Heat may also be a result of the increase current density and resistance of which may further enhance electromigration and the possibility of void formation.

Also, one benefit of the reduced contact area between the first and second metal lines 206, 208 and the via 222 is that a smaller void, for example a void 224, may cause an open circuit or sufficiently increase the e-fuse resistance. Therefore, the e-fuse may be programmed in less time and with lower total power which may produce better efficiency and higher yields. Lower total power also reduces the potential to damage neighboring devices. Therefore, the reduced contact area between the first and second metal lines 206, 208 and the via 222 may be primarily responsible for the lower programming currents and shorter programming times.

Another benefit may include improved programming probability due to the existence of two interfaces, each susceptible to electromigration and void formation. More specifically, the interface being between one of the metal lines and the via liner. For example, one interface may be between the first metal line 206 and the barrier liner 221 of the via 220, and another interface may be between the second metal line 208 and the barrier liner 221 of the via 220. In contrast, the dual damascene e-fuse structure of FIG. 1 has only one interface, between metal line 102 and the via 118. Programming efficiency and reliability may be improved in the present embodiment because there exists two opportunities for void formation. The e-fuse structure may be considered programmed with the formation of a single void. For example, the void 224 between the first metal line 206 and the via 220. Alternatively, a void (not shown) may form between the second metal line 208 and the via 220, either instead of the void 224 or in addition to the void 224.

A further benefit of the present embodiment, is that the interface between either of the metal lines, for example the first metal line 206 or the second metal line 208, and the via 220 will always include a portion of the barrier liner 211, as illustrated in the figures. More specifically, in some embodiments, the interface between the first metal line 206 and the via 220 will be such that the barrier liner 221 at a bottom of the via 220 will be in contact with both the conductive interconnect material and the barrier liner 211 of the first metal line 206. Similarly, the interface between the second metal line 208 and the via 220 will be such that the barrier liner 221 at the bottom of the via 220 will be in contact with both the conductive interconnect material and the barrier liner 211 of the second metal line 208. In such cases, current passing from the via 220 to the first metal line 206 or passing from the via 220 to the second metal line 208 will prefer to travel through the lower resistivity conductive interconnect material as opposed to the barrier liner 211, and thus increase the current density even further than just the reduction in contact area or the reduction in the overlap distance (d) would infer. In other embodiments, the interface between either of the metal lines, for example the first metal line 206 or the second metal line 208, and the via 220 may be such that the barrier liner 221 at the bottom of the via 220 may contact only the barrier liner 211 of either the first metal line 206 or the second metal line 208. Therefore, the current path from either the first metal line 206 or second metal line 208 to the via 220 must include at least a portion a higher resistivity liner, for example the barrier liner 211 of the first and second metal lines 206, 208, which may increase the resistance and promote void formation and fuse blow.

Figure 5A:
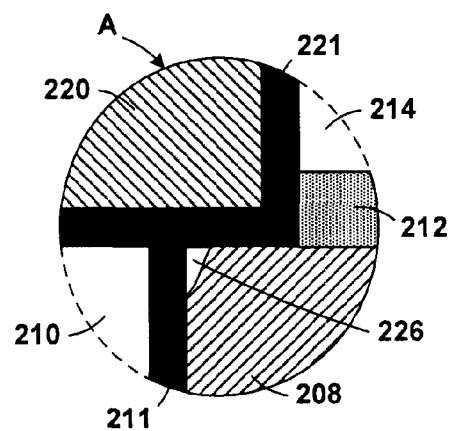
FIG. 5A depicts a section view of FIG. 5, section A, according to an exemplary embodiment.

Yet another advantage of the present embodiment, is that because of the configuration between the two metal lines and the via, the contact area between the metal lines and the via may each include an interface between the barrier liner and the conductive interconnect material, both of the metal line. For example, as illustrated in FIG. 5A, the contact area between the second metal line 208 and the via 220 includes the interface between the barrier liner 211 and the conductive interconnect material, both of the second metal line 208. In contrast, the contact area between the metal line 102 and the via 118, both of FIG. 1, does not include an interface between a barrier liner and the conductive interconnect material of the metal line 102. Rather, the contact area between the metal line 102 and the via 118 includes only the conductive interconnect material of the metal line 102.

A top surface of the barrier liner 211 and a top surface of the conductive interconnect material, both of the second metal line 208 may be co-planar as a result of the chemical mechanical polishing technique referenced above. A small divot 226 may result after the chemical mechanical polishing and associated cleaning techniques. The small divot 226 may form between the barrier liner 211 and the conductive interconnect material of the second metal line 208, as illustrated in FIG. 5A. The same may apply for the first interconnect wire 206, however not illustrated in the figures. In the present embodiment, the via 220 may be formed above the small divot 226. Doing so may encourage electromigration and subsequent failure to occur at the interface between the metal line and the via, in this case the second metal line 208 and the via 220. In such cases, e-fuse failure will reliably occur in a repeatable location and a lower programming current may be used program the e-fuse.

An additional advantage of the present embodiment, is the contact area between the first metal line 206 and the via 220 and the contact area between the second metal line 208 and the via 220 is smaller than the cross sectional area of the via 220. Contrast to FIG. 1 in which the contact area between the metal line 102 and the via 118 is equal to the cross sectional area of the via 118. In order to reduce the contact area between the metal line 102 and the via 118 in FIG. 1, the diameter of the via 118 must be reduced; however the diameter, or size, of the via 118, is limited by lithography. Therefore, the contact area between the metal line 102 and the via 118 in FIG. 1 is also limited by lithography. In the present embodiment, the contact area between either the first metal line 206 and the via 220 or the second metal line 208 and the via 220 may be determined by the spacing between metal lines (206, 208) in addition to the diameter of the via 218. Thus, in the present embodiment, a "sub-lithographic" contact area can be achieved between either the first metal line 206 and the via 220 or the second metal line 208 and the via 220 by using an "at-lithographic" via.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A method comprising:
   forming a first metal line and a second metal line in a first interconnect level, wherein the first metal line is electrically insulated from the second metal line;
   forming a single via in a second interconnect level above the first interconnect level, the via is made from the same material as either the first metal line or the second metal line, and the via is in direct contact with both the first metal line and the second metal line, wherein a contact area between the via and the first metal line or a contact area between the via and the second metal line ranges from about 5% to about 25% of a total cross-sectional area of the via, the contact area and the cross-sectional area of the via being measured at a top surface of the first and second metal lines, and wherein the via has a height to width ratio greater than 1; and
   forming a third metal line in the second interconnect level in direct contact with the via.

2. The method of claim 1, wherein a portion of the first metal line in contact with the via comprises a reduced width, relative to a nominal width of the first metal line.

3. The method of claim 1, wherein a portion of the second metal line in contact with the via comprises a reduced width, relative to a nominal width of the second metal line.

4. The method of claim 1, wherein forming the first and second metal lines comprises:
   etching a first trench and a second trench in a first dielectric layer;
   depositing a barrier liner within the first and second trenches; and
   filling the first and second trenches with a conductive interconnect material to form the first and second metal lines.

5. The method of claim 1, wherein forming the via comprises:
   etching a via opening in a second dielectric layer;
   depositing a barrier liner within the via opening; and
   filling the via opening with a conductive interconnect material to form the via.

6. The method of claim 1, further comprising:
   depositing a first cap dielectric above the first interconnect level after formation of the first and second metal lines; and
   depositing a second cap dielectric above the second interconnect level after formation of the via.

7. The method of claim 1, wherein the via extends from a bottom surface of the third metal line down to a top surface of both the first metal line and the second metal line.

8. The method of claim 7, wherein forming the third metal line comprises:
   etching a third trench in a second dielectric layer;
   depositing a barrier liner within the third trench; and
   filling the third trench with a conductive interconnect material to form the third metal line.

9. The method of claim 1, further comprising:
   applying a programming current to the via causing a void to form below the via within either the first metal line, the second metal line, or both.

10. A structure comprising:
    a first metal line and a second metal line in a first interconnect level, wherein the first metal line is electrically insulated from the second metal line;
    a single via in a second interconnect level above the first interconnect level, the via is made from the same material as either the first metal line or the second metal line, the via is in direct contact with both the first metal line and the second metal line, wherein a contact area between the via and the first metal line or a contact area between the via and the second metal line ranges from about 5% to about 25% of a total cross-sectional area of the via, the contact area and the cross-sectional area of the via being measured at a top surface of the first and second metal lines, and wherein the via has a height to width ratio greater than 1; and
    a third metal line in the second interconnect level in direct contact with the via.

11. The structure of claim 10, wherein a portion of the first metal line in contact with the via comprises a reduced width, relative to a nominal width of the first metal line.

12. The structure of claim 10, wherein a portion of the second metal line in contact with the via comprises a reduced width, relative to a nominal width of the second metal line.

13. The structure of claim 10, further comprising:
    a first cap dielectric above the first interconnect level; and
    a second cap dielectric above the second interconnect level.

14. The structure of claim 10, wherein the via extends from a bottom surface of the third metal line down to a top surface of both the first metal line and the second metal line.

15. The structure of claim 10, further comprising:
    a void located within the first metal line adjacent to an interface between the first metal line and the via.

16. The structure of claim 10, further comprising:
    a void located within the second metal line adjacent to an interface between the second metal line and the via.

17. The structure of claim 10, further comprising:
    a void located below the via within either the first metal line, the second metal line, or both.

18. A structure comprising:
a first metal line in a first interconnect level;
a second metal line in the first interconnect level, wherein the first metal line is electrically insulated from the second metal line;
a single via in a second interconnect level above the first interconnect level, the via is made from the same material as either the first metal line or the second metal line, the via is in direct contact with both the first metal line and the second metal line, wherein an overlap distance between the via and the first metal line or an overlap distance between the via and the second metal line ranges from about 5% to about 25% of a diameter of the via, and wherein the via has a height to width ratio greater than 1; and
a third metal line above and in direct contact with the via.

19. The structure of claim 18, wherein a portion of the first metal line in contact with the via comprises a reduced width, relative to a nominal width of the first metal line, or a portion of the second metal line in contact with the via comprises a reduced width, relative to a nominal width of the second metal line.

20. The structure of claim 18, further comprising:
a void located below the via within either the first metal line, the second metal line, or both.

* * * * *